(12) United States Patent
De Boet et al.

(10) Patent No.: US 10,453,810 B2
(45) Date of Patent: Oct. 22, 2019

(54) INTEGRATED PASSIVE DEVICE FOR RF POWER AMPLIFIER PACKAGE

(71) Applicant: Ampleon Netherlands B.V., Nijmegen (NL)

(72) Inventors: Johannes Adrianus Maria De Boet, Nijmegen (NL); Freerk Van Rijs, Nijmegen (NL); Iordan Konstantinov Sveshtarov, Nijmegen (NL)

(73) Assignee: Ampleon Netherlands B.V. (NL)

( * ) Notice: Subject to any disclaimer, the term of this patent is extended or adjusted under 35 U.S.C. 154(b) by 0 days.

(21) Appl. No.: 16/261,043

(22) Filed: Jan. 29, 2019

(65) Prior Publication Data
US 2019/0172804 A1    Jun. 6, 2019

Related U.S. Application Data

(63) Continuation of application No. 15/655,582, filed on Jul. 20, 2017, now Pat. No. 10,242,960.

(30) Foreign Application Priority Data

Jul. 21, 2016    (NL) .................................... 2017206

(51) Int. Cl.
*H03H 7/38*    (2006.01)
*H01L 23/66*    (2006.01)
(Continued)

(52) U.S. Cl.
CPC .............. *H01L 23/66* (2013.01); *H01L 24/49* (2013.01); *H03F 1/0288* (2013.01);
(Continued)

(58) Field of Classification Search
CPC ........ H03H 7/38; H03H 7/1791; H03F 3/191; H03F 2200/387; H03F 2200/391;
(Continued)

(56) References Cited

U.S. PATENT DOCUMENTS

| | | |
|---|---|---|
| 2002/0014923 A1 | 2/2002 | Saitou |
| 2005/0104679 A1 | 5/2005 | Blednov |

(Continued)

OTHER PUBLICATIONS

NL Written Opinion, NL Application No. 2017206, dated Mar. 13, 2017, 8 pages.

*Primary Examiner* — Stephen E. Jones
(74) *Attorney, Agent, or Firm* — McDonnell Boehnen Hulbert & Berghoff LLP

(57) ABSTRACT

The present disclosure relates to a radio frequency (RF) power transistor package. It further relates to a mobile telecommunications base station comprising such an RF power transistor package, and to an integrated passive die suitable for use in an RF power amplifier package. In example embodiments, an in-package impedance network is used that is connected to an output of the RF power transistor arranged inside the package. This network comprises a first inductive element having a first and second terminal, the first terminal being electrically connected to the output of the RF transistor, a resonance unit electrically connected to the second terminal of the first inductive element, and a second capacitive element electrically connected in between the resonance unit and ground, where the first capacitive element is arranged in series with the second capacitive element.

20 Claims, 8 Drawing Sheets

(51) Int. Cl.

| | | |
|---|---|---|
| *H01L 23/00* | (2006.01) | |
| *H03F 1/02* | (2006.01) | |
| *H03F 1/32* | (2006.01) | |
| *H03F 3/195* | (2006.01) | |
| *H03F 3/24* | (2006.01) | |
| *H03F 1/56* | (2006.01) | |
| *H03F 3/189* | (2006.01) | |
| *H03H 7/01* | (2006.01) | |

(52) U.S. Cl.
CPC .......... *H03F 1/3205* (2013.01); *H03F 1/565* (2013.01); *H03F 3/189* (2013.01); *H03F 3/195* (2013.01); *H03F 3/245* (2013.01); *H03H 7/1791* (2013.01); *H03H 7/38* (2013.01); *H01L 24/48* (2013.01); *H01L 2223/6655* (2013.01); *H01L 2223/6672* (2013.01); *H01L 2224/48137* (2013.01); *H01L 2224/49176* (2013.01); *H01L 2924/1033* (2013.01); *H01L 2924/10253* (2013.01); *H01L 2924/13091* (2013.01); *H01L 2924/19011* (2013.01); *H01L 2924/19015* (2013.01); *H01L 2924/19041* (2013.01); *H01L 2924/19042* (2013.01); *H01L 2924/19043* (2013.01); *H01L 2924/19051* (2013.01); *H01L 2924/19105* (2013.01); *H03F 2200/387* (2013.01); *H03F 2200/391* (2013.01); *H03F 2200/399* (2013.01); *H03F 2200/451* (2013.01)

(58) Field of Classification Search
CPC .... H03F 2200/399; H03F 1/0288; H03F 1/56; H03F 1/565; H01L 2223/6655; H01L 23/66
USPC .......................................................... 333/32
See application file for complete search history.

(56) References Cited

U.S. PATENT DOCUMENTS

| | | |
|---|---|---|
| 2007/0188259 A1 | 8/2007 | Jones et al. |
| 2012/0154054 A1 | 6/2012 | Kaczman et al. |
| 2013/0033325 A1 | 2/2013 | Ladhani et al. |

INTEGRATED PASSIVE DEVICE FOR RF POWER AMPLIFIER PACKAGE

CROSS-REFERENCE TO RELATED APPLICATION

The present application is a continuation of and claims priority to U.S. patent application Ser. No. 15/655,582, filed on Jul. 20, 2017, which is hereby incorporated by reference in its entirety. U.S. patent application Ser. No. 15/655,582 claims priority to Netherlands Patent Application No. 2017206, filed on Jul. 21, 2016, which is also hereby incorporated by reference in its entirety.

TECHNICAL FIELD

The present disclosure relates to a radio frequency (RF) power amplifier package. It further relates to a mobile telecommunications base station comprising such an RF power amplifier package, and to an integrated passive die suitable for such an RF power amplifier package.

BACKGROUND

RF power amplifier packages may comprise a package and a semiconductor die, and the die may be arranged inside the package and provided with an RF power transistor. The RF power transistor may have an output capacitance and may be configured to amplify signals at an operational frequency. An impedance network may be arranged inside the package for providing impedance matching and/or filtering. These packages may be used in base stations for the mobile communications market.

The evolution of the mobile communications market is essentially driven by a continuously increasing amount of data and transmission speed, resulting in a need for an increasingly larger instantaneous signal bandwidth. To linearly amplify wide band signals and minimize the memory effects, it may be useful to terminate the second order intermodulation distortion (IMD) products occurring at relatively low frequencies with very low impedances. If the impedance seen by an RF power transistor at these frequencies is too high, the amplitude of the undesired signal components may increase, and the biasing of the transistor may be affected by feedback of the low-frequency IMD products into the biasing circuitry.

Another aspect of RF power amplifiers is the ability to deliver the output signal at the desired power level. To that end, it may be useful for the RF power transistor to be appropriately impedance matched. In particular, the effective load seen by the RF power transistor should only have a small reactive part. In practice however, most RF power transistors may have a considerable output capacitance. As an example, a laterally diffused metal-oxide-semiconductor (LDMOS) transistor, configured to provide output powers in the range of 150 Watts, may have a drain-source capacitance of approximately 50 pF. In the frequency band of interest, which in the mobile base station market ranges from 600 MHz to 3.5 GHz and more, this capacitance strongly influences the impedance seen at the drain of the LDMOS.

SUMMARY OF THE DISCLOSURE

FIG. 1A illustrates a circuit topology that addresses the abovementioned influence of the output capacitance. This capacitance is denoted by Cds and is present between the drain (d) and source (s) of the FET. In FIG. 1A, a series resonance circuit formed by L1 and C1 is connected to the drain of the FET. Zload models the load that is presented to the FET, and Lfeed models the feed inductance of the biasing circuit.

Due to its relatively large capacitance value, C1 may be configured to act as a ground for signals at the RF operational frequency of the FET. L1 may be chosen such that it will resonate with Cds at or close to the operational frequency. This may allow the reactive part of the impedance seen by the FET to be sufficiently small at the operational frequency. However, at the same time, C1 may resonate with the feed inductance Lfeed of the biasing circuitry at low frequencies. This may introduce a peak in the impedance seen at the drain of the FET, as illustrated in FIG. 1B.

To mitigate this problem, a different topology may be used, which is illustrated in FIG. 2A. This topology differs from the topology in FIG. 1A in that a further inductance L2 and a further capacitance C2 have been included. C2 has a terminal electrically connected to L2 and another terminal electrically connected to ground.

Similar to FIG. 1A, C2 may be very large, even substantially larger than C1, and may act as a ground at RF and lower frequencies. For simplicity, the same component values for L1, Cds, and C1 may be used in the topologies in FIGS. 1A and 2A.

Similar to FIG. 1B, the circuit in FIG. 2A may show a first resonance occurring at a relatively low first resonance frequency related to the resonance between C2 and Lfeed, albeit at a lower frequency due to the influence of L2 and C1. However, a second resonance may occur at an intermediate second resonance frequency related to the resonance of L2 and C1. L2 and C1 form a parallel resonance circuit that will display a transition between a high positive and high negative reactive part near the resonance frequency of L2 and C1. This reactive part will produce the second resonance shown in FIG. 2B.

As can be seen by comparing FIG. 1B and FIG. 2B, the first resonance frequency may be shifted to lower frequencies. This, in combination with the second resonance frequency, may allow a better control of the impedance at the frequencies that are associated with the second order modulation.

To further improve the abovementioned impedance behavior, damping can be introduced. For example, a damping resistor can be placed in series with L2. This resistance may dampen the resonance at the first and second resonance frequencies. At the operational frequency, the combination of L2 and C1 may inhibit RF signals from being dissipated in the resistance, such that the impact of the resistance at the operational frequency may be minimal.

A practical implementation of C2 will include some energy losses. The quality factor of a parallel resonance circuit may generally decrease when its capacitance is increased. This may, in turn, reduce the peak height of the impedance at the first resonance frequency. Hence, to reduce the IMD products, C2 may be chosen to be as large as possible.

The first capacitance C1 may also be arranged inside the package. As this capacitance may have a non-negligible influence on the RF behavior, it may be desirable for the losses of this capacitor to also be minimized.

The available space inside the package may be limited. Consequently, increasing C2 may result in less space being available for C1. This may be particularly true when C1 and C2 are integrated on the same die. For instance, a highly doped substrate of the die may form one of the electrodes, and the electrode may be connected to the flange of the package that acts as ground. Hence, when C2 is increased, less space may be available for grounding C1, which in turn may increase its losses. Therefore, in some approaches, a trade off may be found between increasing control of the impedance at the second-order IMD frequencies and the overall efficiency of the power amplifier.

Embodiments of the present disclosure may provide a circuit topology in which the abovementioned trade-off can be improved.

This may be achieved using the topology as claimed in claim 1, which is characterized in that the second terminal of the first capacitive element is electrically connected to the second capacitive element. For example, the second capacitive element may have a second terminal connected to ground and a first terminal connected to the second terminal of the first capacitive element and to a second terminal of the second inductor. Contrary to the topology of FIG. 2A, the first capacitive element is not directly connected to ground but is connected to the second capacitive element.

As the capacitance of the second capacitive element may be much larger than the capacitance of the first capacitive element, the second capacitive element may have larger electrodes. Furthermore, the second capacitive element may act as a ground at those frequencies for which the losses of the first capacitive element are relevant. By arranging the first capacitive element in series with the second capacitive element, the first capacitive element can use the relatively large electrode of the second capacitive element as an efficient ground connection, thereby avoiding the increased resistance observed in other approaches where the capacitance of the second capacitive element is increased at the expense of the grounding of the first capacitive element.

The first inductive element can be configured to resonate with the output capacitance at or close to the operational frequency. Furthermore, the RF power transistor can be configured to be fed using a feed inductance, and the second capacitive element can be configured to resonate with the feed inductance at a first resonance frequency that is substantially smaller than the operational frequency. The second inductive element can be configured to resonate with the first capacitive element at a second resonance frequency. Here, the first resonance frequency may be substantially smaller than the second resonance frequency, and the second resonance frequency may be substantially smaller than the operational frequency.

The various resonance frequencies mentioned above may differ, to a small extent, from the resonance frequencies associated with the impedance seen at the output of the RF power transistor. For example, the impedance seen at the output of the RF power transistor may comprise a parallel contribution of the output capacitance, the impedance of impedance network, and the impedance associated with a matching network connected to the RF power transistor. A resonance in the overall impedance seen at the output of the RF power transistor can be achieved when the impedance of the impedance network forms an open together with the other impedance contributions. As the impedance of the impedance network near a parallel resonance frequency varies strongly between a large positive value and a large negative value, such a match can be found for a frequency close to the parallel resonance frequency.

The first and/or second inductive element may comprise an integrated inductor and/or a bond wire. An integrated inductor may comprise a spiral conductor and/or a transmission line realized on a substrate, such as a semiconductor die. This die may correspond to the die on which the RF power transistor is located. Alternatively, a separate die may be used on which at least one or all of the abovementioned inductive and capacitive elements are integrated.

The resonance circuit may comprise a resistive element for damping the first and second resonances. This resistive element may be arranged in series with the second inductive element or can be integrated therewith. By appropriately choosing the inductance and capacitance values, the RF performance at the operational frequency may be unaffected or hardly affected by this resistive element.

The first and/or second capacitive element may comprise an integrated capacitor. Such a capacitor may be realized on a substrate, such as the first semiconductor die. Alternatively, the first and second capacitive elements may be integrated on a second die, such as a semiconductor die, and the second die may also be arranged inside the package. The package may comprise a flange and an output lead, wherein the first and/or second die is mounted to the flange, perhaps using a die-bonding technique.

When the package is mounted in a final product, such as on a printed circuit board of a base station amplifier, the flange may be connected to ground. By connecting the dies on the flange, a ground connection can be obtained. In some cases, the first and/or second die may comprise a highly doped substrate allowing a low resistance path through the substrate. Alternatively, vias that extend through the substrate may be used to achieve a ground connection between the upper region of the dies and the bottom region that is connected, in a low-ohmic manner, to the flange.

Examples of integrated capacitors include interdigitated capacitors, fringe capacitors, deep trench capacitors, and metal-insulator-metal capacitors, although the present disclosure does not exclude other types of capacitors. In an example embodiment, the second capacitive element may comprise a deep trench capacitor, and the first capacitive element may comprise a metal-insulator-metal capacitor.

The first capacitive element may comprise a first and a second electrode having a first dielectric arranged therebetween. Furthermore, the second capacitive element may comprise a first and a second electrode having a second dielectric arranged therebetween, wherein the first electrode of the first capacitive element is electrically connected to the first inductive element, and wherein the second electrode of the first capacitive element is electrically connected to the first electrode of the second capacitive element. Here, the second electrode of the second capacitive element can be electrically connected to ground. As the second capacitive element may be substantially larger than the first capacitive element, in such a manner that at the operational frequency the second capacitive element acts as ground, the first capacitive element can use the relatively large first electrode of the second capacitive element as an efficient ground plane.

The first and second dies may be elongated in a first direction, wherein the deep trench capacitor may comprise a plurality of trenches extending in the first die, the second dielectric may be arranged inside the trenches, a top electrode may be arranged over the second dielectric, and a metal contact layer may be arranged on the top electrode, and wherein the metal contact layer may comprise a plurality of slots along the first direction. The second capacitive element may extend a first distance in the first direction, and the slots may extend along a second distance in the first direction, wherein the second distance may be substantially equal to the first distance.

When using a second die, which may be generally located in between the first die and the output lead of the package, return currents may flow through the relatively thin metal contact layer of the deep trench capacitor instead of the flange of the package or the semiconductor substrate. Such current may introduce losses that deteriorate RF performance. By arranging slots that extend in a direction perpendicular to the direction of the RF return current, the RF current can be forced to flow through the flange, which may present a much smaller resistance to the RF return current.

As described above, a resistive element can be used in the resonance unit to dampen the first and second resonances. This resistive element may be integrated on the second die, for example, in the form of a thin film resistor.

The first semiconductor die may comprise an output bond pad assembly, which may be bar-shaped, that is electrically connected to the output. Furthermore, the second die may comprise a first bond pad assembly that is electrically connected to the first capacitive element, and the RF power amplifier package may comprise a first plurality of bond wires that electrically connect the output bond pad assembly to the first bond pad assembly. In this case, the first plurality of bond wires may substantially form the first inductive element, although the present disclosure does not exclude embodiments in which these bond wires cooperate with an integrated inductor, arranged on the first and/or second die, to form the first inductive element.

The RF power amplifier package may comprise a second plurality of bond wires that electrically connect the output bond pad assembly to the output lead. Here, the second plurality of bond wires may form a series inductance between the output of the RF power transistor and the output lead. This inductance may be part of an impedance matching network that is at least partially arranged inside the package. It may also be used as part of an impedance inverter for an integrated Doherty amplifier. In such a case, the RF power amplifier package may comprise at least one other RF power transistor. The plurality of RF power transistors may be biased differently, such that one transistor acts as a main amplifying stage and the other transistor(s) as a peak amplifying stage. Depending on the topology used, the second plurality of bond wires may be used to connect the main or peak amplifying stage to the output lead. It will be understood that other arrangements of Doherty amplifiers that include at least a portion of the impedance inverters and/or signal combiners located inside the package are possible and contemplated herein.

The RF power amplifier package may further comprise a third inductive element and a third capacitive element arranged in series between the output lead and one of the flange, the second die, and/or the second capacitive element. This series combination can be used to perform in-package matching. The third capacitive element may in these cases, at least at the operational frequency, be effectively electrically connected to ground. The flange or the second capacitive element can be used for this purpose. Alternatively, if the second die comprises a highly doped substrate, an electrical connection between the second capacitive element and this substrate could be realized to achieve the ground connection.

The third capacitive element may be integrated on the second die, and the second die may further comprise a second bond pad assembly electrically connected to a terminal of the third capacitive element. In this case, the RF power amplifier package may further comprise a third plurality of bond wires extending from the second bond pad assembly to the output lead. This third plurality of bond wires may at least partially form the third inductive element. Again, the bond wires may be combined with integrated inductors arranged on the second die. The other terminal of the third capacitive element can be electrically connected to one of the flange, the second die, and the second capacitive element.

Alternatively, the second die may comprise a second bond pad assembly, and an integrated third capacitive element having one terminal electrically connected to the second bond pad assembly and another terminal to one of the flange, the second die, and the second capacitive element. The RF power amplifier package may comprise a third plurality of bond wires electrically connecting the second bond pad assembly to the output lead. The RF power amplifier package may further comprise a second plurality of bond wires electrically connecting the second bond pad assembly and the output bond pad assembly.

The third inductive element and the third capacitive element may be configured for providing an impedance match at the operational frequency. The third capacitive element may comprise a deep trench or a metal-insulator-metal capacitor.

The package may further comprise a bias lead and a fourth plurality of bond wires extending from the bias lead to the first bond pad assembly. This may eliminate the need for Lfeed and may provide significant space reduction on the external printed circuit board.

The first resonance frequency may lie in the range of 5 MHz to 20 MHz, the second resonance frequency in the range of 300 MHz to 650 MHz, and the operational frequency in the range of 800 MHz to 3.5 GHz and above.

The first semiconductor die may comprise a Silicon die or a suitable substrate, such as Silicon, Silicon Carbide, or Sapphire, having Gallium Nitride grown epitaxially thereon. The RF power transistor may comprise at least one of a laterally diffused metal-oxide-semiconductor transistor or a field-effect transistor.

According to a further aspect, the disclosure further provides an integrated passive die that is suitable for an RF power amplifier package as above, wherein the integrated passive die comprises the second die as described above.

According to an even further aspect, the disclosure provides a mobile telecommunications base station comprising the RF power amplifier package as described above.

DETAILED DESCRIPTION

Figure 1A:
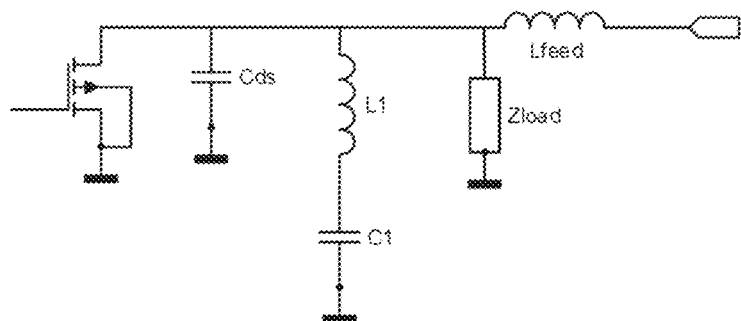
FIG. 1A illustrates a circuit topology for an RF power amplifier, according to an example embodiment.
Figure 1B:
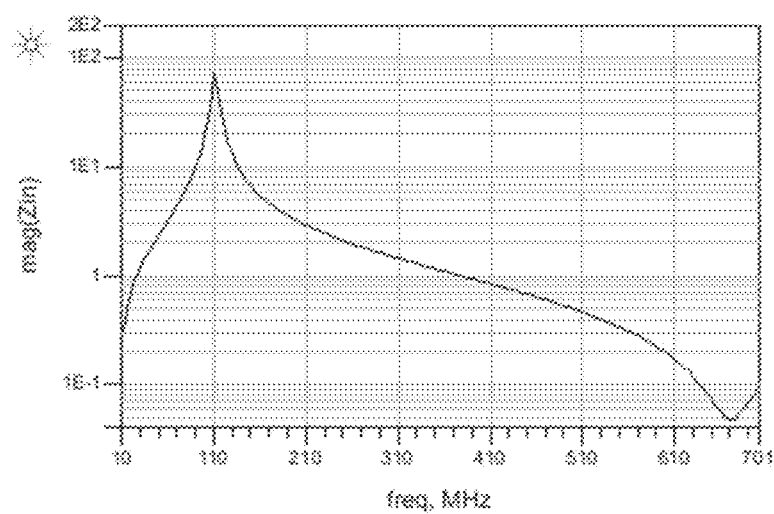
FIG. 1B illustrates an impedance as a function of frequency of the circuit topology depicted in FIG. 1A, according to an example embodiment.
Figure 2A:
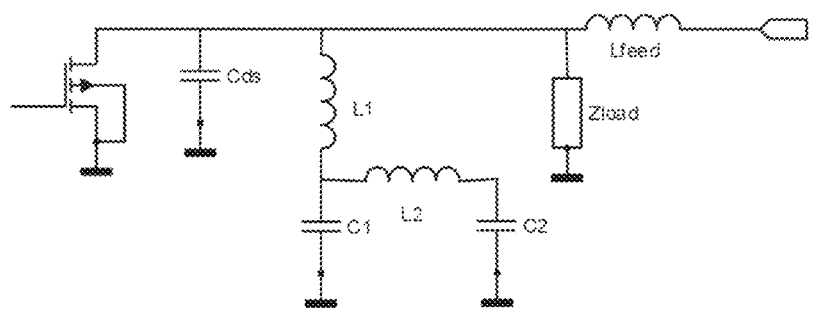
FIG. 2A illustrates a circuit topology for an RF power amplifier, according to an example embodiment.
Figure 2B:
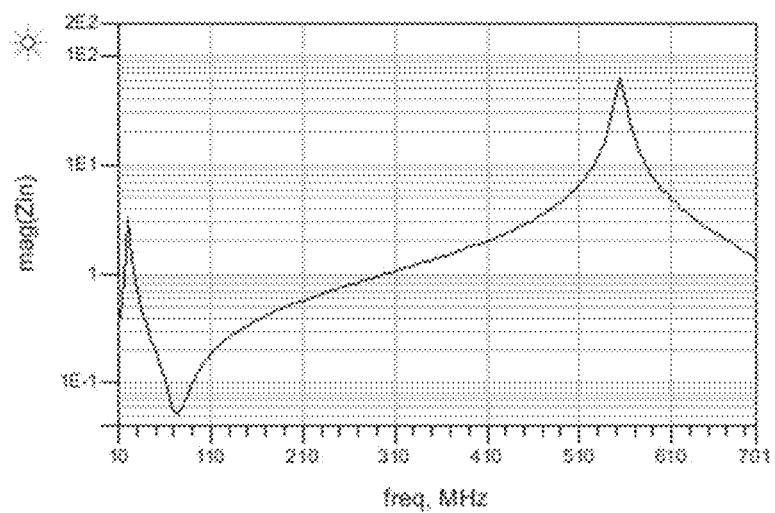
FIG. 2B illustrates an impedance as a function of frequency of the circuit topology depicted in FIG. 2A, according to an example embodiment.
Figure 3A:
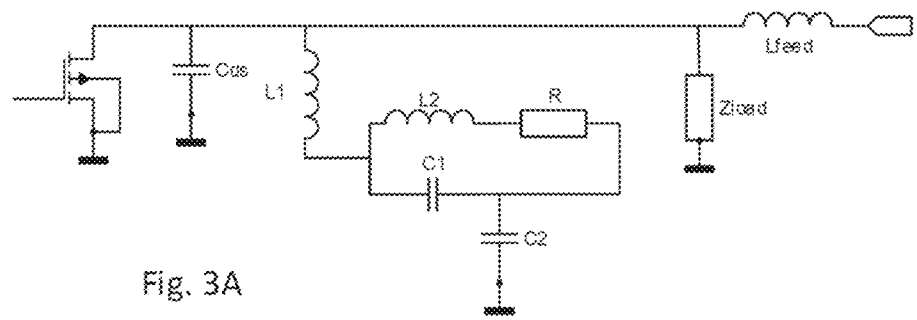
FIG. 3A illustrates a circuit topology for an RF power amplifier, according to an example embodiment.

FIG. 3A illustrates a general topology in accordance with the present disclosure. When comparing this topology with the topology in FIG. 2A, it can be seen that C1 is no longer directly connected to ground but is instead connected to C2. This latter capacitor, being substantially larger than C1, may act as a ground at the operational frequency of the RF power transistor. In addition, a resistive element R is arranged in series with L2.

Figure 3B:
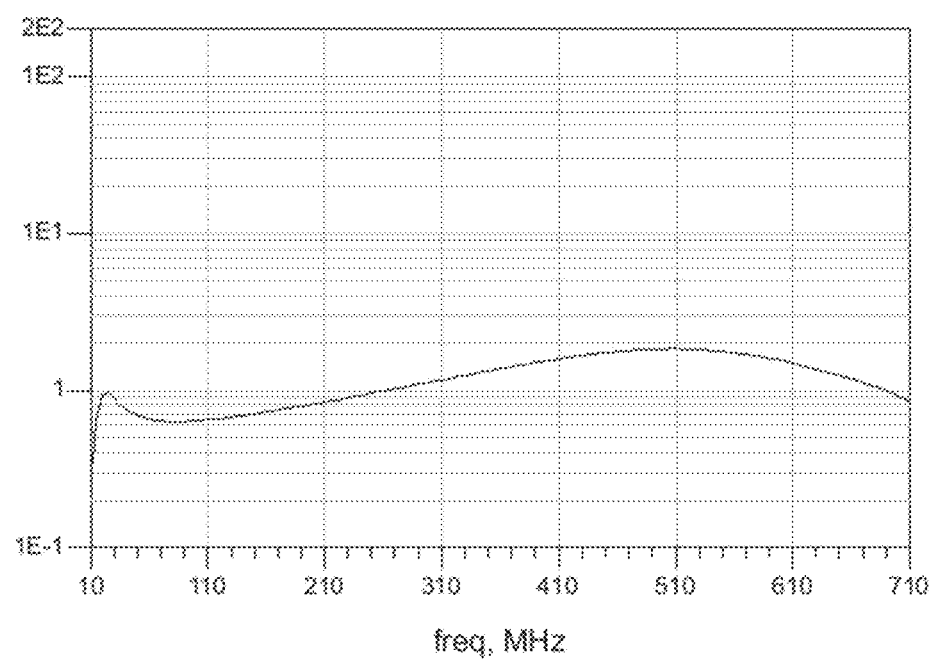
FIG. 3B illustrates an impedance as a function of frequency of the circuit topology depicted in FIG. 3A, according to an example embodiment.

Similar to the topology of FIG. 2A, a first resonance can be observed in the impedance seen looking away from the FET illustrated in FIG. 3B, which can be attributed to the parallel resonance of C2 and Lfeed. At this resonance frequency, the impedance of the series connection of L2 and R may be substantially smaller than the impedance of C1. As such, the effective capacitance that is arranged in parallel to Lfeed may be roughly equal to C2. Moreover, the currents at this frequency may flow through R, causing damping of the resonance peak in the impedance.

A second resonance peak can be observed in FIG. 3B, which can be attributed to the parallel resonance of C1 and L2, similar to the resonance in the topology of FIG. 2A. Also, in this case, current may flow through R, causing damping of the resonance peak in the impedance.

At the operational frequency, L2 may substantially block the RF current, causing the larger part thereof to flow through C1 and C2. Consequently, the impact of the ohmic losses in R may be negligible at these frequencies. Moreover, at these frequencies, the effective capacitance to ground of the resonance unit may be substantially equal to C1, as C1 and C2 are arranged in series. L1 and C1 may be chosen such that, at or close the operational frequency, the resonance circuit acts as an inductance having a value substantially equal to L1. This effective inductance may resonate with Cds to mitigate the impact of Cds at the operational frequency. At this frequency, the RF power transistor may see only the desired impedance realized by the combination of the matching network, which is at least partially arranged outside the package, and the external load.

The description above provides a description of the functionality of the components Cds, L1, L2, R, C1, and C2. It is understood that the values for these components may depend on, inter alia, the desired operational frequency, the size of the RF power transistor and the type of this transistor, the desired impedance behavior of the impedance at the second order IMD frequencies, and the desired bandwidth of the RF power amplifier made using the RF power amplifier package. The disclosure is therefore not limited to a particular range of values of these components.

FIGS. 4A-4D show further topologies in accordance with the present disclosure. Here, an additional capacitor C4 can be identified that models the parasitic capacitance seen at the output lead of the package. Moreover, component C3 and L3 are added to perform an impedance matching inside the package at the operational frequency, for example to perform a downward impedance transformation for transforming the impedance at the output lead when looking at the external load to a lower value seen by the RF power transistor.

Figure 4A:
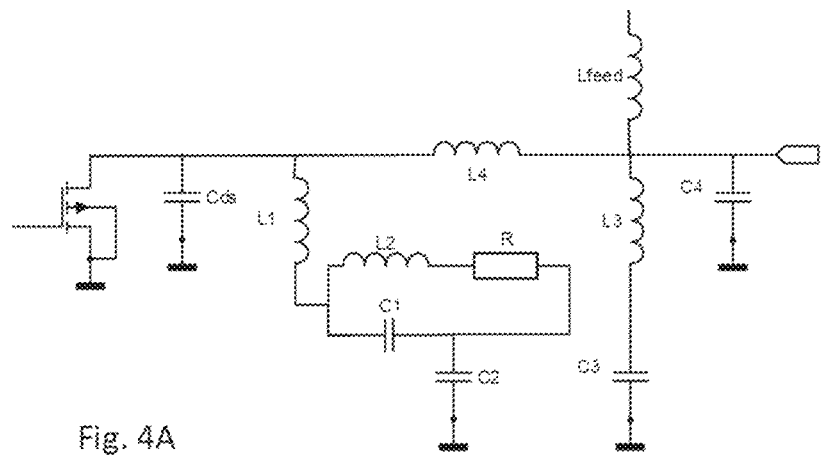
FIG. 4A illustrates a circuit topology for an RF power amplifier, according to an example embodiment.
Figure 4B:
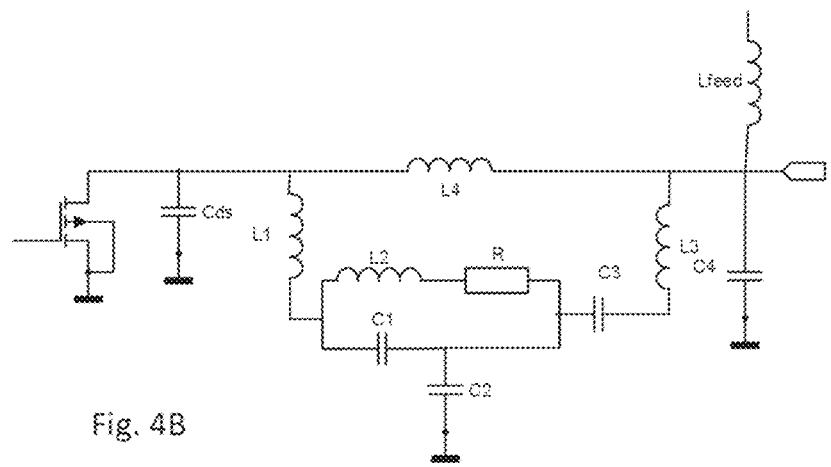
FIG. 4B illustrates a circuit topology for an RF power amplifier, according to an example embodiment.

FIGS. 4A-4D differ in how C3 and L3 are connected. Depending on the desired functionality of L3, different implementations can be identified. For example, if L3 is intended solely for impedance matching, the following matching stages can be identified at the operational frequency:

For the FIG. 4A and 4B topology, a first stage may comprise a series inductance L4 and a shunt capacitance equal to C3, where C4 may be much smaller than C3, and C3 may be much smaller than C2.

Figure 4C:
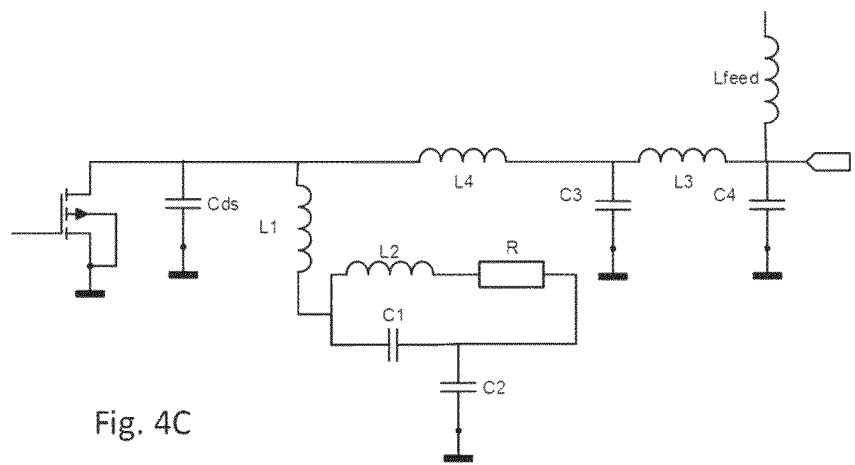
FIG. 4C illustrates a circuit topology for an RF power amplifier, according to an example embodiment.
Figure 4D:
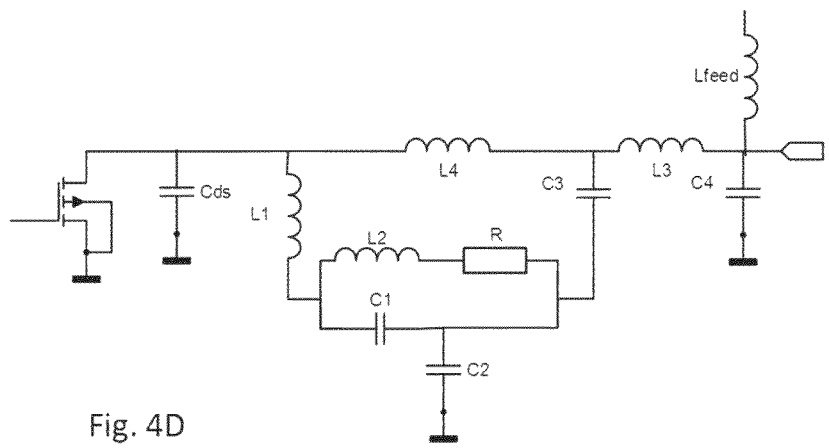
FIG. 4D illustrates a circuit topology for an RF power amplifier, according to an example embodiment.

For the FIG. 4C and 4D topology, a first stage may comprise a series inductance L3 and a shunt capacitance equal to C3, and a second stage may comprise a series inductance L4 and a shunt capacitor equal to C4.

Alternatively, L3 can be part of an impedance inverter, for instance when the RF power amplifier package is to be used in a Doherty amplifier, wherein the RF power amplifier package comprises an RF power transistor acting as a main amplifying stage and an RF power transistor acting as a peak amplifying stage. Referring to FIG. 4A, for example, an equivalent pi-network can be formed by the resonance network, Cds, L3, C3, and L4. These components may perform a 90 degrees phase shift, or multiples thereof, at the operational frequency. In such applications, the resonance unit may be designed such that, at the operational frequency, a residual capacitance exists to form the first shunt capacitor of the pi-network for the impedance inverter.

In FIGS. 4A and 4C, C3 is grounded directly. In practical implementations, C3 may be realized as a discrete capacitor that is mounted to the flange separately from the first and second dies. Alternatively, C3 may be integrated on the first or second die. In this latter case, C3 can be connected to the conducting substrate, which, in turn, can be connected to the flange. When C3 is integrated in the second die, it can be connected to C2, as illustrated in FIGS. 4B and 4D.

Figure 5A:
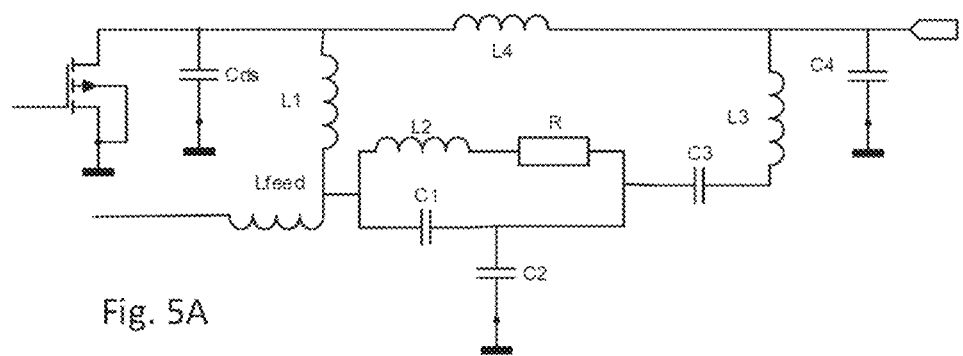
FIG. 5A illustrates a circuit topology for an RF power amplifier, according to an example embodiment

FIG. 5A illustrates an embodiment according to the present disclosure, wherein the feed line, modeled by Lfeed, is integrated in the package and connected to the second die, and more specifically to the first capacitor. This may allow for substantial reduction of the total size of the power amplifier and ease of use of the RF power transistor.

Figure 5B:
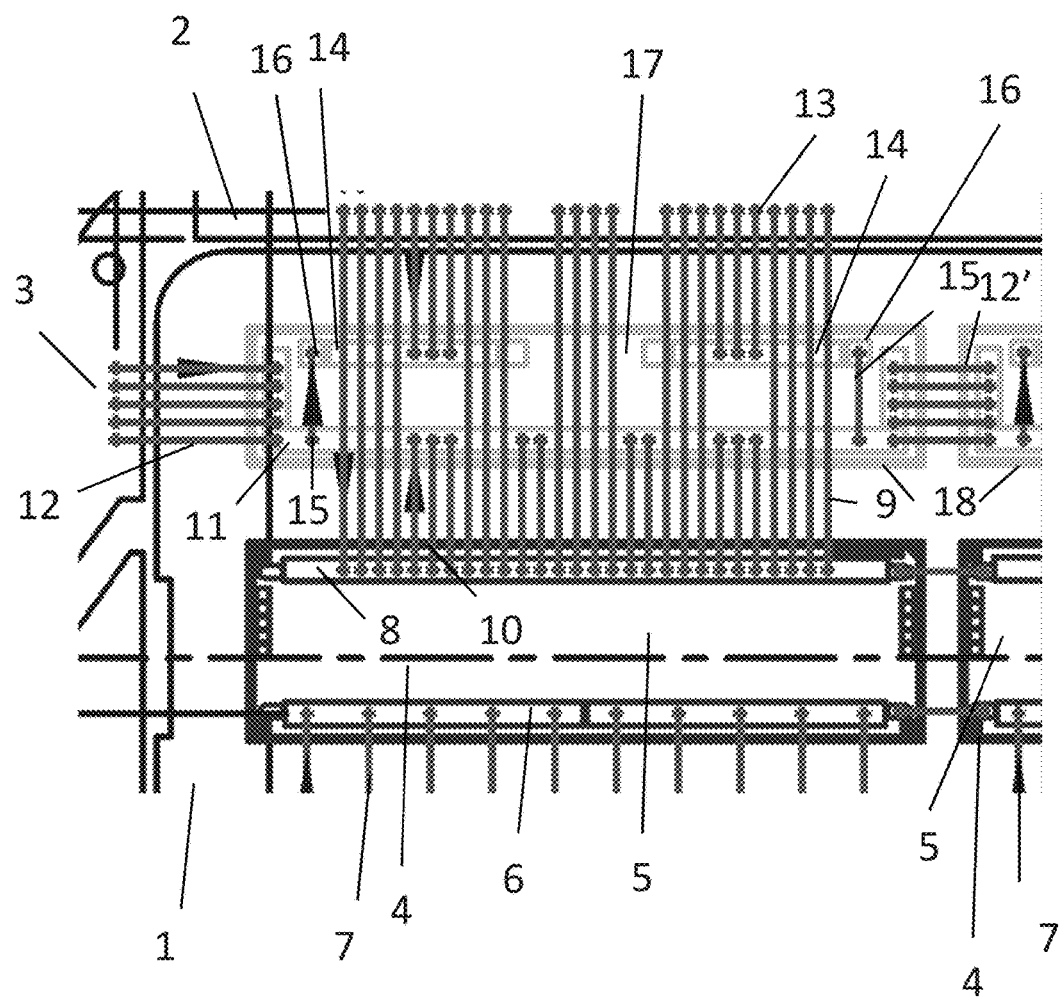
FIG. 5B illustrates an arrangement of an RF power amplifier package, according to an example embodiment.

FIG. 5B illustrates an implementation of the embodiment of FIG. 5A. FIG. 5B shows a package comprising a flange 1, an output lead 2, and a bias lead 3. A pair of semiconductor dies 4 are mounted on the flange 1. On these semiconductor dies 4, RF power transistors 5 are arranged, which are only schematically illustrated. In this example, the RF power transistors 5 are formed as LDMOS transistors arranged on a highly doped substrate.

The gate input of one of the RF transistors 5 is connected to a bar-shaped bond pad assembly 6. A plurality of bond wires 7 are used to connect to the gate of the RF transistor 5.

The drain output of the RF transistor 5 is connected to a bar-shaped bond pad assembly 8. A plurality of bond wires 9, forming L4, connect the drain output to output lead 2. A second plurality of bond wires 10, forming L1, connect the drain output to a U-shaped bond pad assembly 11 that is arranged on a second die 18. This assembly is electrically connected to the common point of L2 and C1. A further plurality of bond wires 12, partially forming Lfeed, connects bias lead 3 to bond pad assembly 11. Bond wires 12' relay the bias to the other RF power transistor 5.

Bond wires 13, forming L3, connect output lead 2 to a bar-shaped bond pad assembly 14 that is electrically connected to a terminal of C3. The other terminal of C3 is connected to the top electrode of C2 (not illustrated). Bond wires 15, forming L2, connect bond pad assembly 11 to a bond pad 16 that is electrically connected to a thin film resistor R that is located at a buried position 17.

Die 18 may comprise a highly doped Silicon substrate on which C2 is distributed as a deep trench capacitor. The top electrode of C2 is connected to the bottom electrode of C1. The other electrode of C2 is formed by the highly doped substrate. The top electrode of C1 is connected to bond pad assembly 11.

The embodiment in FIG. 5B illustrates two separate dies 4, 18 on which the various components can be realized. However, the present disclosure does not exclude embodiments where only a single die is used on which both the active and passive components are integrated.

Figure 6A:
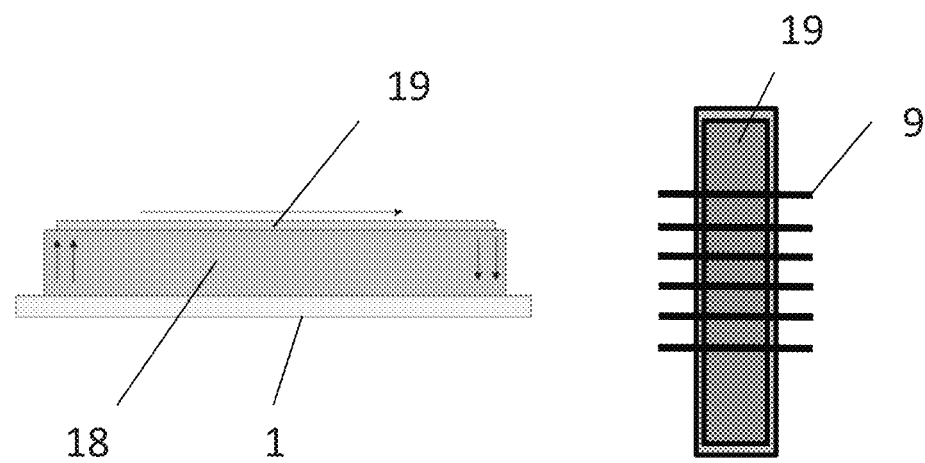
FIG. 6A illustrates a semiconductor die for use in the RF power amplifier package depicted in FIG. 5B, according to an example embodiment.

As can be seen in FIG. 5B, bond wires 9 carry the output current to output lead 2 across die 18. A return current may be associated with this current. This current is schematically illustrated in FIG. 6A. FIG. 6A illustrates the flange 1 on which the die 18 is arranged. FIG. 6A also shows the top electrode of C2, which, in this example, is formed as a 1 micrometer thick metal layer 19. The resistance associated with the metal layer 19 may be much higher than the resistance associated with flange 1. In some scenarios, unwanted losses may be introduced at the operational frequency. The embodiment shown in FIG. 6B may address such scenarios.

Figure 6B:
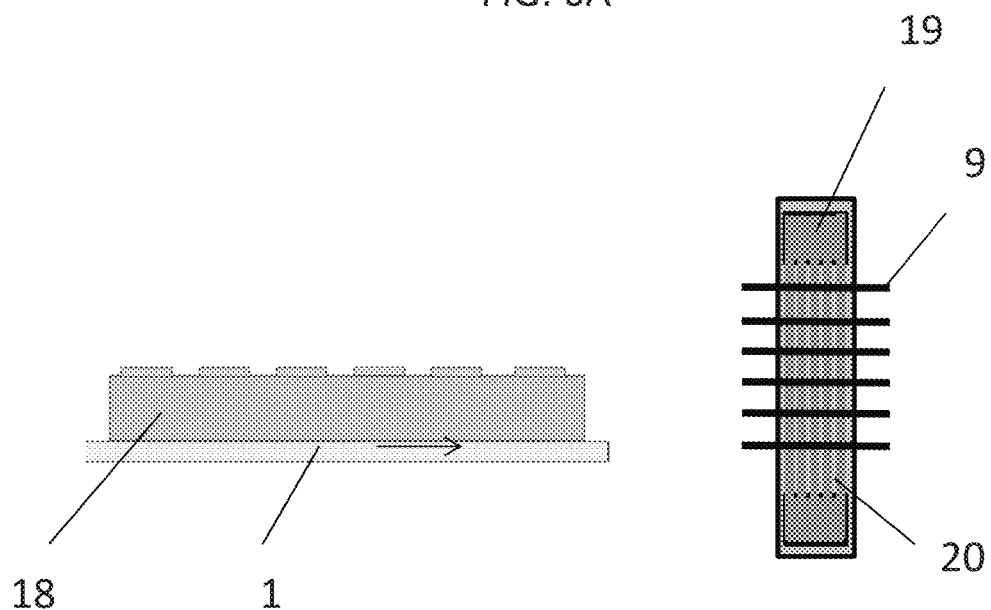
FIG. 6B illustrates a semiconductor die for use in the RF power amplifier package depicted in FIG. 5B, according to an example embodiment.

As shown in FIG. 6B, to direct the return current, slots 20 can be arranged in the metal layer 19 that extend perpendicular to the flow of the return current in FIG. 6A. Generally, C2 may be distributed over the entire die 18, thereby having an elongated structure extending in a first direction. Slots 20 may be arranged along this first direction and may extend over substantially the entire length of the metal layer 19. Using slots 20, the return current may be forced to flow through the flange 1, thereby reducing the losses at the operational frequency.

Although the present disclosure has been described using detailed embodiments thereof, it is understood that the present disclosure is not limited thereto, but that various modifications can be made to these embodiments without departing from the scope of the disclosure which is defined by the appended claims.

What is claimed is:

1. A radio frequency (RF) power amplifier, comprising:
a first semiconductor die, wherein the first semiconductor die comprises an RF power transistor that has an output capacitance (Cds) and is configured to amplify signals at an operational frequency;
an impedance network comprising:
a first inductive element (L1) having a first terminal and a second terminal, the first terminal being electrically connected to an output of the RF transistor;
a resonance unit being electrically connected to the second terminal of L1; and
a second capacitive element (C2) electrically connected in between the resonance unit and a ground terminal;
wherein the resonance unit comprises (i) a second inductive element (L2) electrically connected in between C2 and L1 and (ii) a first capacitive element (C1) having a first terminal and a second terminal, the first terminal of C1 being electrically connected to the second terminal of L1;
wherein the capacitance of C2 is larger than the capacitance of C1;
wherein the second terminal of C1 is electrically connected to C2;
wherein L1, C1, and L2 are chosen such that, at or close to the operational frequency:
an impedance of L2 causes more RF current to flow through C1 than through L2; and
an effective inductance formed by L1, the resonance unit, and C2 resonates with Cds;
wherein the RF power transistor is configured to be fed using a feed inductance (Lfeed), and wherein C2 is configured to resonate with Lfeed at a first resonance frequency that is smaller than the operational frequency;
wherein L2 is configured to resonate with C1 at a second resonance frequency, wherein the first resonance frequency is smaller than the second resonance frequency and wherein the second resonance frequency is smaller than the operational frequency; and
wherein the resonance unit comprises a resistive element for damping signals oscillating at the first and second resonance frequencies.

2. The RF power amplifier of claim 1, wherein at least one of L1 or L2 comprises an integrated inductor or a bond wire.

3. The RF power amplifier of claim 1, wherein the resistive element is arranged in series with L2 or is integrated therewith.

4. The RF power amplifier of claim 1, wherein at least one of C1 or C2 comprises an integrated capacitor.

5. The RF power amplifier of claim 1, wherein:
the first resonance frequency lies in the range of 5 to 20 MHz, the second resonance frequency lies in the range of 300 to 650 MHz, and the operational frequency lies in the range of 800 MHz to 3.5 GHz and above;
the first semiconductor die comprises a Silicon die or a Gallium Nitride die; and
the RF power transistor comprises at least one of a laterally diffused metal-oxide-semiconductor transistor or a field-effect transistor.

6. The RF power amplifier of claim 1, further comprising:
a package, wherein the first semiconductor die and the impedance network are arranged in the package.

7. The RF power amplifier of claim 6, wherein C1 and C2 are integrated on the first semiconductor die, wherein the package comprises a flange and an output lead, and wherein the first die is mounted to the flange.

8. The RF power amplifier of claim 6, wherein the package further comprises a bias lead and a fourth plurality of bond wires extending from the bias lead to C1.

9. The RF power amplifier of claim 6, wherein C1 comprises a first electrode, a second electrode, and a first dielectric arranged between the first and second electrodes of C1, wherein C2 comprises a first electrode, a second electrode, and a second dielectric arranged between the first and second electrodes of C2, wherein the first electrode of C1 is electrically coupled to L1, wherein the second electrode of C1 is electrically coupled to the first electrode of C2, and wherein the second electrode of C2 is electrically connected to the ground terminal.

10. The RF power amplifier of claim 9, wherein:
C1 and C2 are integrated on a second semiconductor die arranged inside the package;
the first and second semiconductor dies are elongated in a first direction;

C2 comprises a deep trench capacitor with a plurality of trenches extending along the second semiconductor die, the second dielectric being arranged inside the plurality of trenches;

a top electrode is arranged over the second dielectric; and a metal contact layer is arranged on the top electrode, wherein the metal contact layer comprises a plurality of slots along the first direction.

11. The RF power amplifier of claim 10, wherein C2 extends a first distance in the first direction, wherein the plurality of slots of the metal contact layer extend along a second distance in the first direction, and wherein the second distance is substantially equal to the first distance.

12. The RF power amplifier of claim 6, wherein C1 and C2 are integrated on a second semiconductor die arranged inside the package, wherein the package comprises a flange and an output lead, and wherein the first and second semiconductor dies are mounted to the flange.

13. The RF power amplifier of claim 12, wherein the resistive element is integrated on the second semiconductor die, and wherein the resistive element is a thin film resistor.

14. The RF power amplifier of claim 12, wherein the first semiconductor die comprises an output bond pad assembly electrically connected to the output of the RF transistor, wherein the second semiconductor die comprises a first bond pad assembly electrically connected to C1, wherein the RF power amplifier package further comprises a first plurality of bond wires that electrically connect the output bond pad assembly of the first semiconductor die to the first bond pad assembly of the second semiconductor die, and wherein the first plurality of bond wires form at least part of L1.

15. The RF power amplifier of claim 14, further comprising a second plurality of bond wires electrically connecting the output bond pad assembly of the first semiconductor die to the output lead of the package.

16. The RF power amplifier of claim 14, wherein the second semiconductor die further comprises:

a second bond pad assembly, and an integrated third capacitive element (C3) having a first terminal electrically connected to the second bond pad assembly and a second terminal electrically connected to the flange, the second semiconductor die, or C2.

17. The RF power amplifier of claim 16, further comprising:

a third plurality of bond wires electrically connecting the second bond pad assembly of the second semiconductor die to the output lead of the package.

18. The RF power amplifier of claim 17, further comprising a third inductive element (L3) arranged in series between (i) the output lead of the package and (ii) the flange, the second semiconductor die, or C2, wherein the third plurality of bond wires form at least part of L3;

wherein L3 and C3 are configured to provide an impedance match for the RF power transistor at the operational frequency, and wherein C3 comprises a deep trench capacitor or a metal-insulator-metal capacitor.

19. An integrated passive die for use in a radio frequency (RF) power amplifier comprising:

a first semiconductor die, wherein the first semiconductor die comprises an RF power transistor that has an output capacitance (Cds) and is configured to amplify signals at an operational frequency;

an impedance network comprising:

a first inductive element (L1) having a first terminal and a second terminal, the first terminal being electrically connected to an output of the RF transistor;

a resonance unit being electrically connected to the second terminal of L1; and a second capacitive element (C2) electrically connected in between the resonance unit and a ground terminal;

wherein the resonance unit comprises (i) a second inductive element (L2) electrically connected in between C2 and L1 and (ii) a first capacitive element (C1) having a first terminal and a second terminal, the first terminal of C1 being electrically connected to the second terminal of L1;

wherein the capacitance of C2 is larger than the capacitance of C1;

wherein the second terminal of C1 is electrically connected to C2;

wherein L1, C1, and L2 are chosen such that, at or close to the operational frequency,:

an impedance of L2 causes more RF current to flow through C1 than through L2; and an effective inductance formed by L1, the resonance unit, and C2 resonates with Cds;

wherein the RF power transistor is configured to be fed using a feed inductance (Lfeed), and wherein C2 is configured to resonate with Lfeed at a first resonance frequency that is smaller than the operational frequency;

wherein L2 is configured to resonate with C1 at a second resonance frequency, wherein the first resonance frequency is smaller than the second resonance frequency and wherein the second resonance frequency is smaller than the operational frequency; and wherein the resonance unit comprises a resistive element for damping signals oscillating at the first and second resonance frequencies.

20. A mobile telecommunications base station comprising a radio frequency (RF) power amplifier, wherein the RF power amplifier of the mobile telecommunications base station comprises:

a first semiconductor die, wherein the first semiconductor die comprises an RF power transistor that has an output capacitance (Cds) and is configured to amplify signals at an operational frequency;

an impedance network comprising:

a first inductive element (L1) having a first terminal and a second terminal, the first terminal being electrically connected to an output of the RF transistor;

a resonance unit being electrically connected to the second terminal of L1; and a second capacitive element (C2) electrically connected in between the resonance unit and a ground terminal;

wherein the resonance unit comprises (i) a second inductive element (L2) electrically connected in between C2 and L1 and (ii) a first capacitive element (C1) having a first terminal and a second terminal, the first terminal of C1 being electrically connected to the second terminal of L1;

wherein the capacitance of C2 is larger than the capacitance of C1;

wherein the second terminal of C1 is electrically connected to C2;

wherein L1, C1, and L2 are chosen such that, at or close to the operational frequency,:

an impedance of L2 causes more RF current to flow through C1 than through L2; and an effective inductance formed by L1, the resonance unit, and C2 resonates with Cds;

wherein the RF power transistor is configured to be fed using a feed inductance (Lfeed), and wherein C2 is configured to resonate with Lfeed at a first resonance frequency that is smaller than the operational frequency;

wherein L2 is configured to resonate with C1 at a second resonance frequency, wherein the first resonance frequency is smaller than the second resonance frequency and wherein the second resonance frequency is smaller than the operational frequency; and wherein the resonance unit comprises a resistive element for damping signals oscillating at the first and second resonance frequencies.

* * * * *